US007009548B2

(12) United States Patent
Chiang et al.

(10) Patent No.: US 7,009,548 B2
(45) Date of Patent: Mar. 7, 2006

(54) VARIABLE ACCURACY PIPELINE ADC FOR WLAN COMMUNICATIONS DEVICES

(75) Inventors: Meei-Ling Chiang, Saratoga, CA (US); Boon-Aik Ang, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/011,510

(22) Filed: Dec. 14, 2004

(65) Prior Publication Data
US 2005/0270217 A1    Dec. 8, 2005

(30) Foreign Application Priority Data
May 28, 2004  (DE)  ............... 10 2004 026 150

(51) Int. Cl.
*H03M 1/38*  (2006.01)
(52) U.S. Cl. ............... 341/161; 341/155; 341/131
(58) Field of Classification Search .............. 341/161, 341/155, 131
See application file for complete search history.

(56) References Cited

U.S. PATENT DOCUMENTS

| 6,340,944 B1 | 1/2002 | Chang et al. | |
|---|---|---|---|
| 6,577,185 B1 | 6/2003 | Chandler et al. | |
| 6,600,440 B1 * | 7/2003 | Sakurai | 341/161 |
| 6,686,860 B1 | 2/2004 | Gulati et al. | |
| 6,700,524 B1 * | 3/2004 | Naka et al. | 341/161 |
| 6,741,200 B1 * | 5/2004 | Lebedev | 341/161 |
| 6,744,832 B1 | 6/2004 | Miao | |
| 6,756,929 B1 * | 6/2004 | Ali | 341/161 |
| 6,861,969 B1 * | 3/2005 | Ali | 341/161 |
| 6,870,495 B1 * | 3/2005 | Zadeh et al. | 341/161 |

OTHER PUBLICATIONS

Translation of Office Action in German application No. 10 2004 026 150.4-42 mailed Jan. 28, 2005.

* cited by examiner

*Primary Examiner*—Peguy Jeanpierre
*Assistant Examiner*—Lam T. Mai
(74) *Attorney, Agent, or Firm*—Meyertons Hood Kivlin Kowert & Goetzel, P.C.; B. Noël Kivlin

(57) ABSTRACT

A pipeline ADC (Analog to Digital Converter) unit is provided that has a first and a second multi-stage portion. The first multi-stage portion has a first plurality of converter stages for converting a first analog signal to a first digital signal having a first digital resolution. The second portion has a second plurality of converter stages to convert a second analog signal to a second digital signal having a second digital resolution. The second plurality includes the first plurality. The pipeline ADC unit selectively uses either the first plurality of stages alone, or the second plurality. The pipeline ADC unit may be used in a WLAN (Wireless Local Area Network) communication device.

34 Claims, 4 Drawing Sheets

VARIABLE ACCURACY PIPELINE ADC FOR WLAN COMMUNICATIONS DEVICES

BACKGROUND OF THE INVENTION

1. Field of the Invention

The invention generally relates to pipeline ADC (Analog to Digital Converter) units, and in particular to WLAN (Wireless Local Area Network) communication devices such as transmitters, receivers and transceivers, and corresponding integrated circuit chips and methods, where pipeline ADC units are used for converting analog transmission and/or reception signals to digital data.

2. Description of the Related Art

A wireless local area network is a flexible data communications system implemented as an extension to or as an alternative for, a wired LAN. Using radio frequency or infrared technology, wireless LANs transmit and receive data over the air, minimizing the need for wired connections. Thus, wireless LANs combine data connectivity with user mobility.

Most WLAN systems use spread spectrum technology, a wide-band radio frequency technique developed for use in reliable and secure communication systems. The spread spectrum technology is designed to trade-off bandwidth efficiency for reliability, integrity and security. Two types of spread spectrum radio systems are frequently used: FHSS (Frequency Hopping Spread Spectrum) and DSSS (Direct Sequence Spread Spectrum) systems.

The standard defining and governing wireless local area networks that operate in the 2.4 GHz spectrum is the IEEE 802.11 standard. To allow higher data rate transmissions, the standard was extended to the 802.11b standard that allows data rates of 5.5 and 11 Mbps in the 2.4 GHz spectrum. This extension is backwards compatible as far as it relates to direct sequence spread spectrum technology, but it adopts a new modulation technique called CCK (Complementary Code Keying) which allows the speed increase.

Further extensions to the IEEE 802.11 standard exist. For instance, the IEEE 802.11a and 802.11g specifications use the OFDM (Orthogonal Frequency Division Multiplexing) technique which is a wireless transmission technique that splits signals into sub signals that are then transmitted at different frequencies simultaneously. The 802.11g version of OFDM uses a combination of BPSK (Binary. Phase. Shift. Keying), QPSK (Quadrature. Phase. Shift. Keying), and QAM (Quadrature. Amplitude. Modulation), depending on the chosen data rate.

Thus, a variety of different modulation types and methods exist within 802.11 compliant WLAN systems. Not all of the possible transmission modes have to be supported by each individual WLAN device, but multi-mode WLAN devices exist that support at least part of the possible modes.

As WLAN systems are digital data communication systems, communication devices in such systems use ADC units to convert analog signals to digital data. One of several different kinds of analog to digital converters are pipeline ADC units. Pipeline ADC units provide an optimum balance of size, speed, resolution, power dissipation, and analog design efforts. Also known as subranging quantizers, pipeline ADC units consist of numerous consecutive stages. An example of a conventional pipeline ADC unit is depicted in FIG. 1.

As apparent from this figure, the pipeline ADC unit comprises M-1 stages 100–120 and a digital correction unit 130 to convert an incoming analog signal to an M-bit digital output signal. The stages 100–120 often include ADC/ MDAC (Multiplying Digital to Analog. Converter) circuits, and there may also be a sample/hold amplifier at the input side of the pipeline.

An example of an individual conventional stage architecture is shown in FIG. 2. As can be seen, each stage has a sample/hold amplifier 200, a coarse ADC 210 to approximate the input signal, and an MDAC circuit 220 together with a summing circuit 230 to subtract the quantized signal from the input. This difference is then amplified by an amplifier 240 to provide the analog residue that is forwarded to the next stage.

Thus, referring back to FIG. 1, each stage receives an analog signal from the preceding stage, outputs an analog signal to the succeeding stage, and delivers the digital data downwards to the digital correction unit 130. The digital correction unit 130 corrects the offsets in the quantizers, i.e. in the ADC units within the MDAC circuit.

One of the possible pipeline ADC architectures is a pipeline 1.5b/stage architecture with nine stages, i.e. M=10. In this architecture, each stage generates two bits with the sub-ADC 210, and amplifies the resulting residue by a gain of 2. The sample and hold function may then be realized by buffering switch-capacitor gain blocks allowing concurrent processing. The resulting 18 bits are delayed accordingly and combined with digital correction to yield a 10-bit digital output signal.

While such pipeline ADC units have a high data resolution which may be useful for instance in 802.11g compliant WLAN systems, the units suffer from the rather high power consumption. Taking a multi-mode WLAN communications device, this high power consumption then also applies in modes such as 802.11b compliant WLAN modes, where the 10-bit accuracy is not required. Thus, multi-mode WLAN devices would need both a 10-bit pipeline and a, e.g., 6-bit pipeline, to adjust power consumption and digital resolution to the individual operational mode. However, this does lead to significant circuit development and manufacturing costs so that this approach is frequently of no practical use.

Also when considering single-mode WLAN communication devices, the circuit developers need to create and maintain circuit designs for various pipeline ADC structures of different lengths. This makes the handling with such circuits more cumbersome and is quite inefficient in practice.

SUMMARY OF THE INVENTION

A pipeline ADC unit for use in a WLAN communication device, a corresponding WLAN communication device, an integrated circuit chip, and a method of operating such a pipeline ADC unit are provided that may improve efficiency, accuracy and circuit density, and reduce the number of component parts required, thereby facilitating the circuit design.

In one embodiment, a pipeline ADC unit for use in a WLAN communication device is provided. The pipeline ADC unit comprises a first multi-stage portion comprising a first plurality of converter stages adapted to convert a first analog signal to a first digital signal having a first digital resolution. The pipeline ADC unit further comprises a second multi-stage portion comprising a second plurality of converter stages adapted to convert a second analog signal to a second digital signal having a second digital resolution. The second plurality of converter stages comprises the first plurality of converter stages. The pipeline ADC unit is adapted to selectively use either the first plurality of converter stages alone, or the second plurality of converter stages.

In another embodiment, a WLAN communication device comprising a pipeline ADC unit is provided. The pipeline ADC unit comprises a first multi-stage portion comprising a first plurality of converter stages adapted to convert a first analog signal to a first digital signal having a first digital resolution. The pipeline ADC unit further comprises a second multi-stage portion comprising a second plurality of converter stages adapted to convert a second analog signal to a second digital signal having a second digital resolution. The second plurality of converter stages comprises the first plurality of converter stages. The pipeline ADC unit is adapted to selectively use either the first plurality of converter stages alone, or the second plurality of converter stages.

Further, an integrated circuit chip having pipeline ADC circuitry is provided. The pipeline ADC circuitry comprises a first multi-stage circuit comprising a first plurality of converter stages adapted to convert a first analog signal to a first digital signal having a first digital resolution. The pipeline ADC circuitry further comprises a second multi-stage circuit comprising a second plurality of converter stages adapted to convert a second analog signal to a second digital signal having a second digital resolution. The second plurality of converter stages comprises the first plurality of converter stages. The pipeline ADC circuitry is adapted to selectively use either the first plurality of converter stages alone, or the second plurality of converter stages.

In yet another embodiment, a method of operating a pipeline ADC unit is provided that has a first multi-stage portion comprising a first plurality of converter stages adapted to convert a first analog signal to a first digital signal having a first digital resolution, and a second multi-stage portion comprising a second plurality of converter stages adapted to convert a second analog signal to a second digital signal having a second digital resolution. The second plurality of converter stages comprises the first plurality of converter stages. The method comprises determining an operational mode to be used by the pipeline ADC unit, and selectively using either the first plurality of converter stages alone, or the second plurality of converter stages, depending on the determined operational mode.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

The illustrative embodiments of the present invention will be described with reference to the figure drawings wherein like elements and structures are indicated by like reference numbers.

Figure 1:
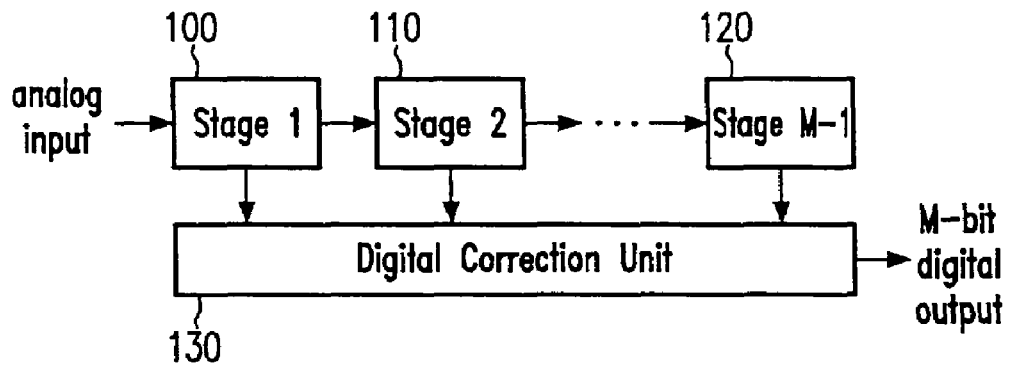
FIG. 1 is a block diagram illustrating the architecture of a conventional pipeline ADC unit.
Figure 2:
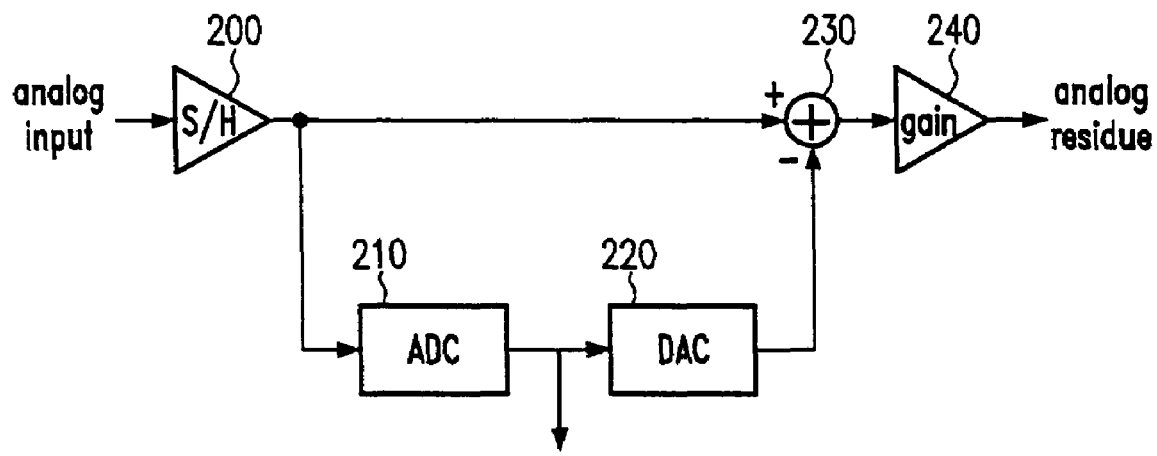
FIG. 2 is block diagram illustrating the components of the stages in the pipeline of FIG. 1.
Figure 3:
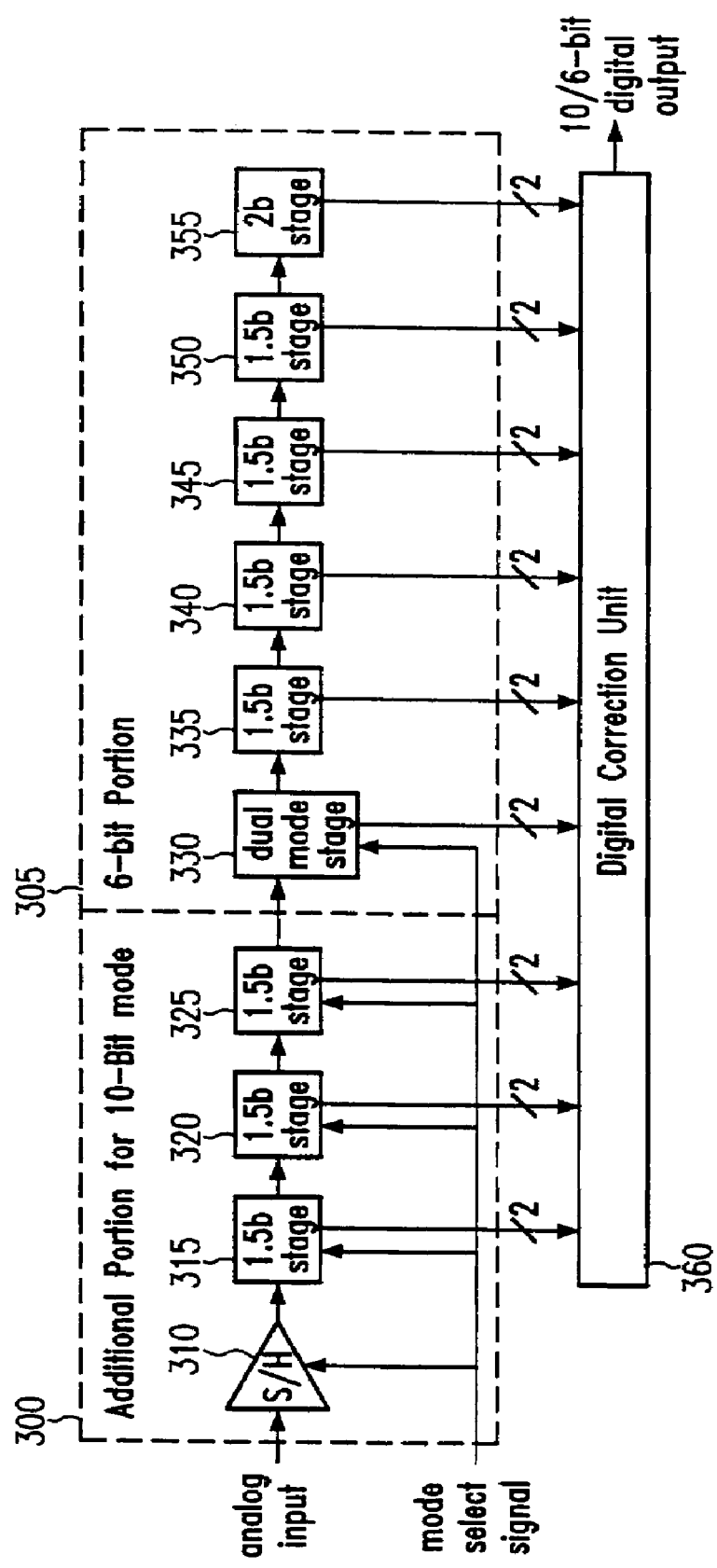
FIG. 3 is a block diagram illustrating a variable accuracy pipeline ADC unit according to an embodiment.

Turning now to FIG. 3, a variable accuracy pipeline ADC unit according to an embodiment is depicted that may be used in WLAN communication devices. As may be seen from the figure, the pipeline has a 6-bit portion 305 and an additional portion 300 for a 10-bit mode. Further, the various stages 315–355 provide data bits to the digital correction unit 360 that forms a 10-bit or 6-bit digital output signal depending on the operational mode.

Accordingly, a 10-bit pipeline ADC unit is partitioned to achieve a dual accuracy 10-bit/6-bit ADC. In the 6-bit mode, only the stages in the 6-bit portion 305 are active, while the additional circuitry 300 is disabled. In the 10-bit mode, the entire circuitry is used. Thus, the circuits of the 6-bit portion 305 are used in both the 6-bit mode and the 10-bit mode.

To switch the modes, a mode select signal is provided to the sample/hold amplifier 310, to the 1.5b/stages 315–325 of the additional portion 300, and to the first stage 330 of the 6-bit portion 305. If the mode select signal indicates that the 6-bit mode is to be used, the units 310–325 are turned off so that the incoming analog signal passes these stages without modification. In another embodiment, the units 310–325 are turned off in a manner so that they block the signal path. In that case, it would be necessary to provide the incoming analog signal not only to the head of block 300 but also, separately, to the head of block 305. If the mode select signal indicates the 10-bit mode, the sample/hold amplifier 310 is turned on and the stages 315–325 are operated in the same manner as stages 335–350.

In addition, the mode select signal controls the dual mode stage 330 in a manner that is described in more detail below. Briefly stated, the dual mode stage 330 performs a function similar to that of the sample/hold amplifier 310 in the 6-bit mode, and the function of the various 1.5b/stages 315–325, 335–350 in the 10-bit mode.

Consequently, a pipeline ADC is provided where one part of the pipeline is used in all modes while another part is used only in the higher resolution mode. To allow for this dual use, at least a part of the lower resolution portion 305 has dual mode capabilities so as to have different functions in the different modes.

Therefore, a very modular design for pipeline ADC units is provided which allows for easy and quick circuit design, in particular where the design of the low resolution portion 305 is already complete. As will be shown with reference to FIGS. 4 to 6, the modification to stage 330 is a very simple one so that circuit development and manufacturing is significantly facilitated and the number of component parts reduced.

Figure 4:
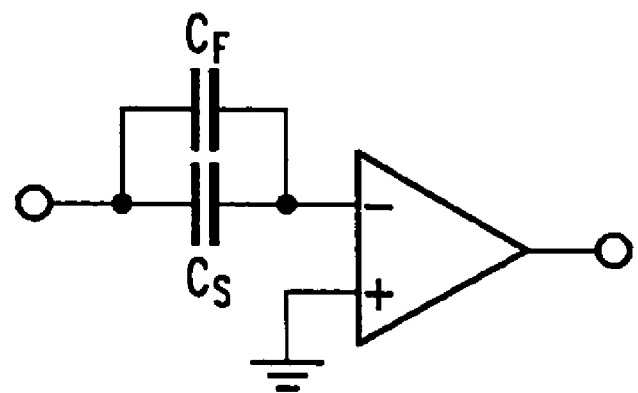
FIG. 4 illustrates the components used in the dual mode stage of the pipeline ADC unit of FIG. 3, to be used during the sample phase in both the 6-bit and 10-bit mode.
Figure 5:
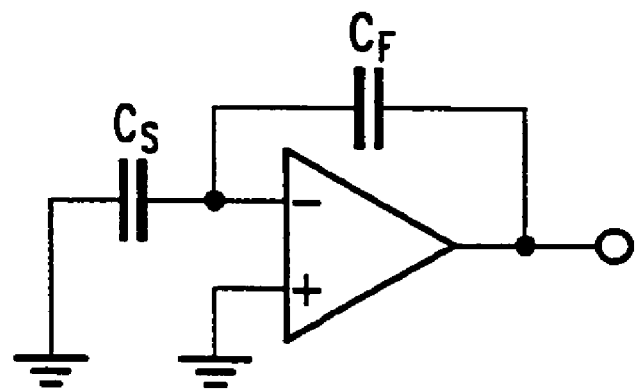
FIG. 5 illustrates circuitry used in the dual mode stage of the pipeline ADC unit of FIG. 3 during the hold phase in the 6-bit mode.
Figure 6:
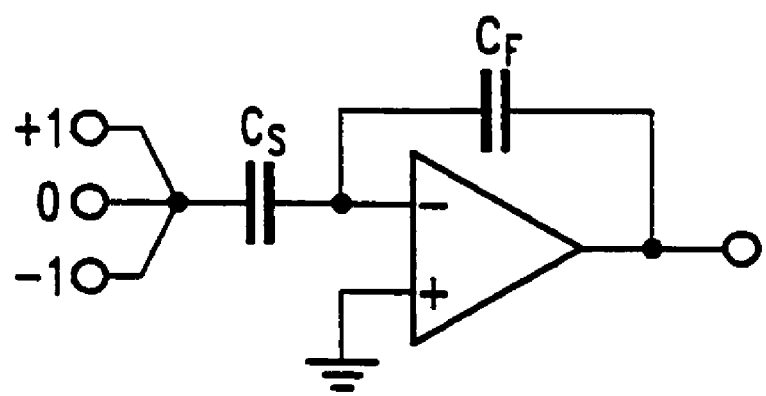
FIG. 6 illustrates circuitry used in the dual mode stage of the pipeline ADC unit of FIG. 3, during the hold phase in the 10-bit mode.

Turning now to FIGS. 4 to 6, implementations of the dual mode stage 330 are shown according to an embodiment. It is to be noted that for simplicity reasons, only the single-ended implementations are shown.

FIG. 4 shows circuitry in the dual mode stage 330 that may be used in both the 6-bit and 10-bit modes during sample phase.

FIG. 5 illustrates circuitry to be used in the 6-bit mode during the hold phase. In this mode, the dual mode stage 330 operates as sample/hold amplifier with a gain of 2.

FIG. 6 illustrates the corresponding circuitry of the dual mode stage 330 in the 10-bit mode during the hold phase, where the dual mode stage 330 operates as 1.5b/stage unit. In the circuitry of FIG. 6, the selection of the input switch depends on the MDAC logic output of the preceding stage.

As already mentioned above, the partitioning of a 10-bit pipeline allows for operating both the 10-bit and 6-bit modes by disabling certain stages in the low resolution mode which are not needed. Thus, the pipeline ADC architecture of the embodiments is switchable between different digital resolutions and leads to higher or lower power consumption in the different operational modes. This allows for saving power in modes where no high resolution is needed.

Figure 7:
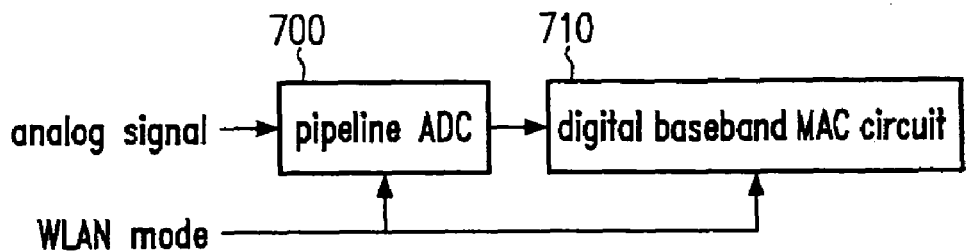
FIG. 7 is a block diagram illustrating how the pipeline ADC unit of the embodiments can be used in a WLAN communication device.

An example of how to use the pipeline ADC unit according to the embodiments in a WLAN communication device is depicted in FIG. 7. The pipeline ADC is shown as block 700 that receives the analog signal, e.g. from an RF (Radio. Frequency) block, and outputs the converted digital signal to the digital baseband MAC (Media. Access. Control) circuit 710 to decipher the received analog signal according to the 802.11b/g standards. In embodiments, a WLAN communication device may use the pipeline ADC 700 in a receiver, in a transmitter, or in a transceiver.

As apparent from FIG. 7, the pipeline ADC unit 700 further receives the mode select signal which depends on the WLAN mode. For instance, the mode select signal may indicate the lower power consumption 6-bit mode of operation in 802.11b compliant WLAN systems, or the higher power consumption 10-bit mode of operation in 802.11g compliant WLAN systems. In the 802.11b WLAN mode, the additional portion 300 of the pipeline ADC 700 is disabled and the dual mode stage 330 assumes the function of a sample/hold amplifier. In the 802.11g WLAN mode, the dual mode stage 330 operates as 1.5b/stage.

Figure 8:
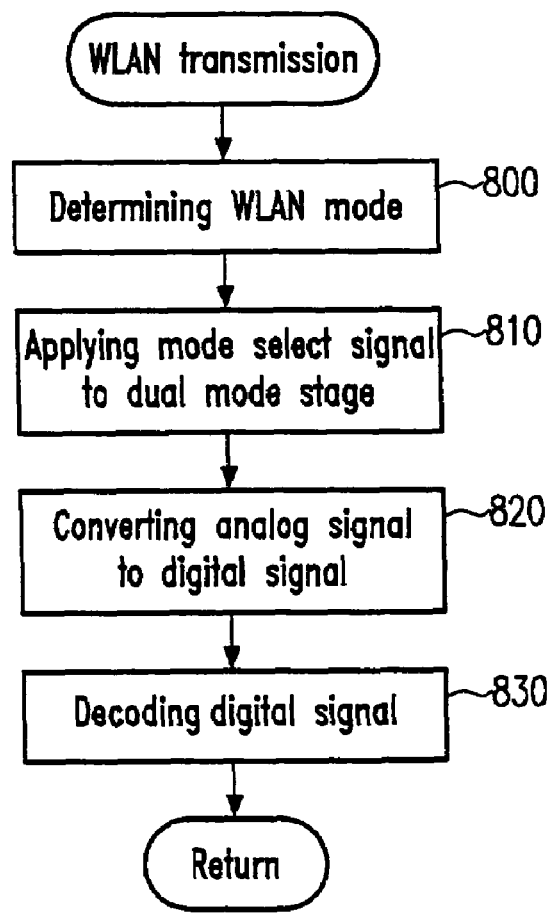
FIG. 8 is a flow chart illustrating the process of operating a WLAN communication device using a variable accuracy pipeline ADC according to an embodiment.

Referring now to FIG. 8, a flow chart is provided that exemplarily illustrates how the WLAN communication device of FIG. 7 can be used. In step 800, the WLAN mode is determined so that a mode select signal may be applied in step 810 to the dual mode stage 330 and the additional portion 300 of the pipeline ADC unit 700. In step 820, the incoming analog signal is then converted to the digital signal, and the digital signal is decoded in step 830 by the digital baseband MAC circuit 710.

In the embodiment of FIG. 3, the last stage of the 6-bit portion 305 is a 2b stage comprising a. Flash analog to digital converter circuit.

Although the above embodiments have been described to be switchable between two modes to provide dual accuracy, other embodiments exist where more than two different digital resolutions can be used. In this case, more than two portions 300, 305 are present, and more than two dual mode stages 330 are used. For instance, in a pipeline ADC unit that is adapted to handle three different digital resolutions (leading to three different power consumption values), the lower resolution and medium resolution portions would each have a dual mode stage similar to that of stage 330, but being switchable by different mode select signals.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. A pipeline ADC (Analog to Digital Converter) unit for use in a WLAN (Wireless Local Area Network) communication device, comprising:
    a first multi-stage portion comprising a first plurality of converter stages adapted to convert a first analog signal to a first digital signal having a first digital resolution;
    a second multi-stage portion comprising a second plurality of converter stages adapted to convert a second analog signal to a second digital signal having a second digital resolution;
    wherein said second plurality of converter stages comprises said first plurality of converter stages, and
    wherein said pipeline ADC unit is adapted to selectively use either said first plurality of converter stages alone, or said second plurality of converter stages.

2. The pipeline ADC unit of claim 1, wherein said second multi-stage portion further comprises a third plurality of converter stages adapted to receive said second analog signal and provide a third analog signal based thereon, wherein said first plurality of converter stages comprised in said second plurality of converter stages is connected to said third plurality of converter stages to receive said third analog signal.

3. The pipeline ADC unit of claim 2, wherein at least one stage of said first plurality of converter stages is a variable mode stage capable of operating in at least two modes depending on whether said pipeline ADC unit is using said first plurality of converter stages alone, or said second plurality of converter stages.

4. The pipeline ADC unit of claim 3, wherein said at least one stage of said first plurality of converter stages is located at the head of said first multi-stage portion.

5. The pipeline ADC unit of claim 3, wherein said at least one stage of said first plurality of converter stages is adapted to operate like any other stage of the first plurality in case said pipeline ADC unit is using said second plurality of converter stages.

6. The pipeline ADC unit of claim 3, wherein said at least one stage of said first plurality of converter stages comprises a sample/hold circuit operable in a specific mode in case said pipeline ADC unit is using said first plurality of converter stages alone.

7. The pipeline ADC unit of claim 6, wherein said sample/hold circuit has a gain of two during the hold phase.

8. The pipeline ADC unit of claim 3, wherein said at least one stage is connected to receive a mode select signal indicating whether to use said first plurality of converter stages alone, or said second plurality of converter stages, said mode select signal being also provided to said third plurality of converter stages to control their function.

9. The pipeline ADC unit of claim 2, wherein said third plurality of converter stages is connected to receive a mode select signal indicating whether to use said first plurality of converter stages alone, or said second plurality of converter stages, wherein said third plurality of converter stages are adapted to be turned off if said mode select signal indicates that said pipeline ADC unit is to use said first plurality of converter stages alone.

10. The pipeline ADC unit of claim 1, wherein said first digital resolution is lower than said second digital resolution.

11. The pipeline ADC unit of claim 10, wherein said first digital resolution is a 6-bit resolution and said second digital resolution is a 10-bit resolution.

12. The pipeline ADC unit of claim 1, wherein said first and second multi-stage portions are of a pipeline 1.5b/stage architecture.

13. The pipeline ADC unit of claim 12, wherein the 1.5-bits stages of said pipeline 1.5b/stage architecture comprise a multiplying digital to analog converter circuit.

14. The pipeline ADC unit of claim 12, wherein the last stage of said first plurality of converter stages comprises a 2-bits analog to digital converter circuit.

15. The pipeline ADC unit of claim 1, wherein said pipeline ADC unit is adapted to select either said first plurality of converter stages alone, or said second plurality of converter stages, based on a mode select signal, said mode select signal depending on the WLAN transmission mode used by said WLAN communication device.

16. The pipeline ADC unit of claim 15, wherein said pipeline ADC unit is adapted to select said first plurality of converter stages alone, in case said WLAN transmission mode is a 802.11b compliant mode, and to select said second plurality of converter stages in case said WLAN transmission mode is a 802.11g compliant mode.

17. A WLAN (Wireless Local Area Network) communication device comprising a pipeline ADC (Analog to Digital Converter) unit comprising:
a first multi-stage portion comprising a first plurality of converter stages adapted to convert a first analog signal to a first digital signal having a first digital resolution;
a second multi-stage portion comprising a second plurality of converter stages adapted to convert a second analog signal to a second digital signal having a second digital resolution;
wherein said second plurality of converter stages comprises said first plurality of converter stages, and
wherein said pipeline ADC unit is adapted to selectively use either said first plurality of converter stages alone, or said second plurality of converter stages.

18. An integrated circuit chip having pipeline ADC (Analog to Digital Converter) circuitry comprising:
a first multi-stage circuit comprising a first plurality of converter stages adapted to convert a first analog signal to a first digital signal having a first digital resolution;
a second multi-stage circuit comprising a second plurality of converter stages adapted to convert a second analog signal to a second digital signal having a second digital resolution;
wherein said second plurality of converter stages comprises said first plurality of converter stages, and
wherein said pipeline ADC circuitry is adapted to selectively use either said first plurality of converter stages alone, or said second plurality of converter stages.

19. A method of operating a pipeline ADC (Analog to Digital Converter) unit having a first multi-stage portion comprising a first plurality of converter stages adapted to convert a first analog signal to a first digital signal having a first digital resolution, and a second multi-stage portion comprising a second plurality of converter stages adapted to convert a second analog signal to a second digital signal having a second digital resolution, wherein second plurality of converter stages comprises said first plurality of converter stages, the method comprising:
determining an operational mode to be used by said pipeline ADC unit; and
selectively using either said first plurality of converter stages alone, or said second plurality of converter stages, depending on the determined operational mode.

20. The method of claim 19, wherein the step of selectively using the stages comprises:
receiving said second analog signal at a third plurality of converter stages of said second multi-stage portion;
providing a third analog signal by said third plurality of converter stages based on said second analog signal; and
receiving said third analog signal at said first plurality of converter stages comprised in said second plurality of converter stages from said third plurality of converter stages.

21. The method of claim 20, further comprising:
operating at least one stage of said first plurality of converter stages as a variable mode stage in at least two modes depending on whether said pipeline ADC unit is using said first plurality of converter stages alone, or said second plurality of converter stages.

22. The method of claim 21, wherein said at least one stage of said first plurality of converter stages is located at the head of said first multi-stage portion.

23. The method of claim 21, further comprising:
operating said at least one stage of said first plurality of converter stages like any other stage of the first plurality in case said pipeline ADC unit is using said second plurality of converter stages.

24. The method of claim 21, further comprising:
operating a sample/hold circuit of said at least one stage of said first plurality of converter stages in a specific mode in case said pipeline ADC unit is using said first plurality of converter stages alone.

25. The method of claim 24, further comprising:
operating said sample/hold circuit to have a gain of two during the hold phase.

26. The method of claim 21, further comprising:
receiving a mode select signal at said at least one stage, said mode select signal indicating whether to use said first plurality of converter stages alone, or said second plurality of converter stages; and
providing said mode select signal also to said third plurality of converter stages to control their function.

27. The method of claim 20, further comprising:
receiving a mode select signal at said third plurality of converter stages, said mode select signal indicating whether to use said first plurality of converter stages alone, or said second plurality of converter stages; and
turning off said third plurality of converter stages if said mode select signal indicates that said pipeline ADC unit is to use said first plurality of converter stages alone.

28. The method of claim 19, wherein said first digital resolution is lower than said second digital resolution.

29. The method of claim 28, wherein said first digital resolution is a 6-bit resolution and said second digital resolution is a 10-bit resolution.

30. The method of claim 19, wherein said first and second multi-stage portions are of a pipeline 1.5b/stage architecture.

31. The method of claim 30, wherein the 1.5-bits stages of said pipeline 1.5b/stage architecture comprise a multiplying digital to analog converter circuit.

32. The method of claim 30, wherein the last stage of said first plurality of converter stages comprises a 2-bits analog to digital converter circuit.

33. The method of claim 19, further comprising:

selecting either said first plurality of converter stages alone, or said second plurality of converter stages, based on a mode select signal, said mode select signal depending on the WLAN (Wireless Local Area Network) transmission mode used by a WLAN communication device comprising said pipeline ADC unit.

34. The method of claim 33, further comprising:

selecting said first plurality of converter stages alone, in case said WLAN transmission mode is a 802.11b compliant mode, and said second plurality of converter stages in case said WLAN transmission mode is a 802.11g compliant mode.

* * * * *